(12) United States Patent
Feiweier (10) Patent No.: US 11,175,362 B2
(45) Date of Patent: Nov. 16, 2021

(54) METHOD AND SYSTEM FOR SIMULTANEOUS MULTI-SLICE NUCLEAR SPIN TOMOGRAPHY

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/804,558

(22) Filed: Feb. 28, 2020

(65) Prior Publication Data

US 2020/0278409 A1 Sep. 3, 2020

(30) Foreign Application Priority Data

Feb. 28, 2019 (DE) .......................... 102019202749.0

(51) Int. Cl.
*G01R 33/54* (2006.01)
*G01R 33/561* (2006.01)

(52) U.S. Cl.
CPC ....... *G01R 33/543* (2013.01); *G01R 33/5616* (2013.01)

(58) Field of Classification Search
CPC .............. G01R 33/543; G01R 33/5616; G01R 33/4818; G01R 33/5611; G01R 33/4835
See application file for complete search history.

(56) References Cited

U.S. PATENT DOCUMENTS

| 8,405,395 B2 | 3/2013 | Setsompop et al. |
| 9,588,208 B2 | 3/2017 | Polimeni et al. |
| 9,778,336 B2 | 10/2017 | Polimeni et al. |

(Continued)

FOREIGN PATENT DOCUMENTS

WO 2018213358 A1 11/2018

OTHER PUBLICATIONS

Gagoski, Borjan A., et al. RARE/turbo spin echo imaging with simultaneous multislice Wave-CAIPI. Magnetic resonance in medicine, 2015, 73. Jg., Nr. 3, S. 929-938.

(Continued)

*Primary Examiner* — Susan S Lee
(74) *Attorney, Agent, or Firm* — Schiff Hardin LLP (57) ABSTRACT

A flexibly and universally applicable method for simultaneous multi-slice nuclear spin tomography is provided. Thereby, a pulse space region to be sampled is specified by means of a processor, wherein a first pulse space dimension ($k_y$) is assigned to a first phase-encoded axis and a second pulse space dimension ($k_z$) is assigned to a second phase-encoded axis and the second phase-encoded axis corresponds to a slice axis. An undersampling scheme is specified by means of the processor, wherein along the second pulse space dimension ($k_z$), an incomplete sampling is provided. Then, a magnetic resonance scan is carried out within the pulse space region to be sampled according to the undersampling scheme and according to respective phase-encodings of the first and second phase-encoded axis.

17 Claims, 6 Drawing Sheets

(56) References Cited

U.S. PATENT DOCUMENTS

| | | | |
|---|---|---|---|
| 9,778,338 B2 | 10/2017 | Setsompop et al. | |
| 2007/0096733 A1* | 5/2007 | Arunachalam | G01R 33/5611 324/309 |
| 2016/0131729 A1* | 5/2016 | Kang | G01R 33/50 324/309 |
| 2018/0031659 A1 | 2/2018 | Bhat et al. | |

OTHER PUBLICATIONS

Zahneisen, Benjamin, et al. Three-dimensional Fourier encoding of simultaneously excited slices: generalized acquisition and reconstruction framework. Magnetic resonance in medicine, 2014, 71. Jg., Nr. 6, S. 2071-2081, Jun. 2014 // https://doi.org/10.1002/mrm.24875.

Barth, Markus, et al. Simultaneous multislice (SMS) imaging techniques. Magnetic resonance in medicine, 2016, 75. Jg., Nr. 1, S. 63-81. US 2018/0 031 659 A1.

German action dated Jan. 20, 2020, for Application No. 10 2019 202 749.0.

German Action dated May 18, 2020, Application No. 10 2019 202 749.0, and English translation attached.

* cited by examiner

METHOD AND SYSTEM FOR SIMULTANEOUS MULTI-SLICE NUCLEAR SPIN TOMOGRAPHY

CROSS REFERENCE TO RELATED APPLICATIONS

This patent application claims priority to German Patent Application No. 102019202749.0, filed Feb. 28, 2019, which is incorporated herein by reference in its entirety.

BACKGROUND

Field

The disclosure relates to a method for simultaneous multi-slice nuclear spin tomography, whereby a pulse space region to be sampled is specified by means of a processor, whereby a first pulse space dimension is assigned to a first phase-encoded axis. The disclosure further relates to a system for simultaneous multi-slice nuclear spin tomography and a corresponding computer program and a computer-readable storage medium.

Related Art

In the last few years, methods for the rapid recording of magnetic resonance (MR) images by simultaneous excitation of a plurality of separate slices have become established. Thereby, a plurality of slices can be imaged in the same time in which otherwise just one slice would have been recorded. In particular, in this regard, methods for simultaneous multi-slice (SMS) imaging are used in which, for example, concepts of parallel imaging (e.g. GRAPPA, SENSE) can be applied to a slice encoding direction.

As described in U.S. Pat. No. 8,405,395 B2, for methods with single excitation in echoplanar image acquisition or "single shot echoplanar imaging" (SS-EPI), the signals of simultaneously applied slices are manipulated such that a targeted mutual displacement of the overlaid slice images in the position space results.

For segmented recording methods, for example, those which are based on a plurality of excitation pulses or "multi-shot" (MS), efficient approaches to determining necessary gradient moments for such displacements are not known. This is due to the fact that necessary calculations according to known methods with multiple excitations can be extremely laborious, complex and error-prone.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Against this background, it is an object of the present disclosure to provide an improved concept for simultaneous multi-slice nuclear spin tomography which is flexibly and universally usable for different recording techniques, in particular, with multiple excitation and a simpler and systematic determination of the required gradient moments.

The improved concept is based upon the idea of undertaking a phase-encoding along the slice axis, along which the slices to be simultaneously excited are arranged, and to combine it with an incomplete sampling along the slice axis.

According to a first independent aspect of the improved concept, a method for simultaneous multi-slice nuclear spin tomography, SMS is provided. According to the method, a pulse space region to be sampled is specified by means of a processor, whereby a first pulse space dimension is assigned to a first phase-encoded axis and a second pulse space dimension is assigned a second phase-encoded axis. Thereby, the second phase-encoded axis corresponds to a slice axis. In particular, the first phase-encoded axis lies perpendicularly to the slice axis. An undersampling scheme is specified by means of the processor, whereby at least along the second pulse space dimension, an incomplete sampling is provided. Then a magnetic resonance scan, in particular, by means of a magnetic resonance tomography device is carried out within the pulse space region to be sampled according to the undersampling scheme and according to respective phase-encodings of the first and second phase-encoded axis.

The pulse space can also be designated the k-space, as is often the case in the context of magnetic resonance tomography.

The expression tomography thereby denotes the imaging of an object, or of its spatial structure in the form of slice images. In particular, the improved concept is not restricted to medical applications.

The pulse space region can be, in particular, a three-dimensional pulse space region or a two-dimensional pulse space region, in particular a sub-space region of the three-dimensional pulse space region. In the case of a three-dimensional pulse space region, a third pulse space dimension can be assigned to a third phase-encoded or frequency-encoded axis, whereby the third axis lies, in particular, perpendicularly to the first and the second axis.

The specification of the pulse space region to be sampled includes, for example, a specification of an extent of the pulse space region to be sampled and a discretization of the pulse space region, that is, a specification of discrete points in the pulse space with defined spacings along the two or three dimensions of the pulse space.

The specification of the pulse space region to be sampled takes place, for example, on the basis of a pre-defined image region to be acquired in the position space, also called the "field of view" (FOV). The specification of the pulse space region to be sampled can take place, for example, taking account of or adhering to the sampling theorem, also called the Nyquist theorem or the Nyquist-Shannon sampling theorem.

The discretization of the pulse space region to be sampled can take place, for example, in that a spacing between two adjacent discrete points in the pulse space along a pulse space dimension corresponds specifically to the inverse of an extent of the FOV along the associated position space dimension. Alternatively, the spacing can be reduced according to an oversampling factor.

The specification of the pulse space region can take account of symmetries of the pulse space, for example, in order to reduce the extent of the pulse space region to be sampled.

A "phase-encoded axis" or "frequency-encoded axis" can be understood, for example, as an axis along which a spatial encoding is realized during the magnetic resonance scan, which corresponds to a phase-encoding or a frequency-encoding.

The slice axis can be, for example, a spatial direction along which the two or more slices that are to be simultaneously excited are arranged, so that the slice axis lies perpendicularly to the respective slice planes.

The first axis can correspond, for example, to a position space dimension parallel to the slice planes, that is, perpendicular to the slice axis. The same applies, if relevant, to the third axis.

The fact that an incomplete sampling along the second pulse space dimension is provided can mean, for example, that at least for a part of the pulse space region to be sampled, a sampling of fewer points takes place along the slice axis, that is, the second pulse space dimension than would be required for a complete sampling according to the sampling theorem. This can mean, for example, that there is at least one pulse space coordinate of the first pulse space dimension, that is, at least one row along the slice axis for which either less than half of all pulse space coordinates of the second pulse space dimension is sampled or, if for these pulse space coordinates of the first pulse space dimension, at least two pulse space coordinates of the second pulse space dimension are sampled, at least one non-sampled pulse space coordinate of the second pulse space dimension lies between both the sampled pulse space coordinates of the second pulse space dimension.

The sampling along the first pulse space dimension can, depending upon the undersampling scheme, take place incompletely or completely.

By means of the specification of the undersampling scheme, it is thus defined, for example, which of the discrete points of the pulse space region to be sampled are sampled.

Through the combination of the SMS with the phase-encoding along the slice axis, the improved concept permits a systematic determination of required gradient moments for the performance of the magnetic resonance scan, since pulse space coordinates can be assigned in a defined manner to each point to be sampled in all dimensions of the pulse space region to be sampled. Since the gradient moments serve specifically for the targeted displacement of the pulse space coordinates between individual steps of the magnetic resonance scan, these are systematically, universally and flexibly determinable. A method according to the improved concept permits, in particular, a less complex and thus less error-prone determination of the gradient moments. These advantages lead, in particular, thereto that even for SMS, segmented recording methods and, in particular, multiple excitations can be used.

According to at least one embodiment of the method, through the specification of the undersampling scheme, coordinate pairs to be sampled are determined, whereby each coordinate pair contains a first coordinate in relation to the first pulse space dimension and an associated second coordinate in relation to the second pulse space dimension.

Below, the first pulse space dimension are denoted as the $k_y$-axis or -direction and the associated pulse space coordinates as $k_y$-coordinates or y-coordinates. The second pulse space dimension is denoted as the $k_z$-axis or -direction and the associated pulse space coordinates as $k_z$-coordinates or z-coordinates. The third pulse space dimension is denoted as the $k_x$-axis or -direction and the associated pulse space coordinates as $k_x$-coordinates or x-coordinates.

Each coordinate pair of the determined coordinate pairs to be sampled defines the y- and z-coordinates of the points to be sampled in the pulse space region. Accordingly, one or more x-coordinates belong to each pair of y- and z-coordinates. In particular, the coordinate pairs to be sampled contain all the combinations to be sampled from y-, z-coordinates, so that together with the associated x-coordinates, all the points to be sampled are defined in the pulse space region.

The coordinate pairs can be placed and stored, for example, in a list. A sequence of the coordinate pairs in this list does not necessarily correspond at this point to an actual temporal sequence of samplings during the magnetic resonance scan. The coordinate pairs placed in the list can be stored as dimensionless coordinate pairs, whereby the corresponding pulse values result from a multiplication of the respective dimensionless coordinates by an associated pulse increment according to the sampling theorem, which is thus, in particular, equal to an inverse of the corresponding extent, possibly taking account of the oversampling factor of the associated image region.

Thus, for example, a systematic allocation of all the points to be sampled in the pulse space region is possible. In particular, the second pulse space dimension assigned to the slice axis is treated similarly to the first pulse space dimension.

According to at least one embodiment, for the performance of the magnetic resonance scan, scan signals are recorded during associated recording time periods. Each recording time period is assigned according to a segmentation scheme to one, in particular exactly one, excitation pulse so that at least one segmentation index is unambiguously assigned to each recording time period.

The segmentation scheme corresponds, for example, to an assignment of the recording time periods to one or more excitation pulses and/or to one or more refocusing pulses.

Accordingly, the segmentation scheme can be identified or defined by one of more segmentation indices. The segmentation indices can contain, for example, an echo index which numbers or indicates the associated recording time periods for a given excitation pulse. The segmentation indices can also contain an excitation index, in particular if a plurality of excitation pulses are applied, that is, if in particular, an MS technique is used. The excitation index then indicates or numbers the different excitation pulses. The segmentation indices can also contain a refocusing index, in particular if according to the image acquisition, a plurality of refocusing pulses is used. The refocusing index then indicates or numbers the individual refocusing pulses.

A tuple of segmentation indices is thus unambiguously assigned to each recording time period, called below a segmentation tuple, whereby the segmentation tuple can be a 1-tuple, a 2-tuple, a 3-tuple and so on, depending on the complexity of the segmentation scheme.

The scan signals are, in particular, scan signals, which can also be designated echo signals.

The excitation pulse is, in particular, a high frequency pulse which serves to tilt nuclear spins by an angle, in particular, an Ernst angle, for example by 90°, in particular out of an alignment along the slice axis.

In the context of an SS-EPI, for example, all the recording time periods are assigned to a single excitation pulse. In the context of MS recordings, the recording time periods are divided, for example evenly, among one or more excitation pulses.

By assignment of the recording time periods to the segmentation index, a temporal sequence of the recording time periods is defined such that a temporal sequence of the recording time periods correspond to a sequence of the segmentation indices. In the case of only one index, the sequence corresponds directly to the index. In the case of two indices, one of the indices defines a sequence of groups of recording time periods and a second index defines a sequence within the respective groups. This can be continued similarly, for a plurality of indices.

It can be the object of the segmentation to prevent long signal evolution times. The latter can lead to signal loss, for example, by means of relaxation effects and/or accumulation of undesirable signal phases, for example, due to non-ideal recording conditions.

Advantageously, according to the improved concept, any desired segmentations, including multiple segmentations, are possible.

According to at least one embodiment, each recording time period is assigned to a refocusing pulse according to the segmentation scheme, so that at least two segmentation indices are unambiguously assigned to each recording time period.

The at least two segmentation indices can contain, for example, the echo index and the excitation index or the echo index and the refocusing index.

The refocusing pulses involve, in particular, 180° high frequency pulses, also referred to as 180° inversion pulses. A refocusing pulse serves to rotate the nuclear spin about an axis that lies perpendicularly to the alignment of the main magnetic field, by 180°. For each excitation pulse, for example, no, one or a plurality of refocusing pulses can be provided.

Advantageously, the improved concept can thus also be used for image acquisition concepts and segmentations with refocusing pulses. Thereby, a cumulative influence of field inhomogeneities, interference through differences of magnetic susceptibility at tissue boundaries or movements of an object under examination can be compensated for or prevented.

According to at least one embodiment, for carrying out the magnetic resonance scan, each coordinate pair is assigned to exactly one tuple of segmentation indices in order to define a sequence of a sampling of the coordinate pairs during the magnetic resonance scan.

Each combination of y and z-coordinates to be sampled in the pulse space region to be sampled is thus assigned to a segmentation tuple, that is, as a consequence exactly one recording time period.

The tuple of segmentation indices can also be a tuple with only one segmentation index, that is, a 1-tuple which contains, for example, the echo index.

Through the assignment of the coordinate pairs to the segmentation tuples, a sequence of the sampling of the different y- and z-points in the pulse space region is defined.

According to at least one embodiment, in particular during the magnetic resonance scan, at least one gradient moment is applied between samplings of two successive coordinate pairs according to the sequence, the value of which is determined from at least one pulse difference between the successive, in particular immediately successive, coordinate pairs.

If the successive coordinate pairs have, for example, different y-coordinates, then a y-gradient moment arises directly from the difference between the y-coordinates of the successive coordinate pairs. In particular, the y-gradient moment is provided by a pulse difference in the y-direction of the successive coordinate pairs divided by the gyromagnetic ratio.

If the successive coordinate pairs have, for example, different z-coordinates, then a z-gradient moment to be applied arises directly from the pulse difference in the z-direction of the successive coordinate pairs. In particular, the z-gradient moment is provided by the pulse difference in the z-direction of the successive coordinate pairs divided by the gyromagnetic ratio.

Through the definition of the gradient moments, a sampling path or a sampling route is enabled within the pulse space region to be sampled.

Embodiments of the improved concept thus offer a simple, flexible and universal scheme for determining the gradient moments, in particular for different MS image acquisition variants. The gradient moments thereby result directly from the sequence of the samplings of the coordinate pairs by the assignment of the coordinate pairs to the tuples from segmentation indices.

According to at least one embodiment, between the application of an excitation pulse and a sampling of a coordinate pair to be sampled directly after the excitation pulse, at least one pre-phasing moment is applied, the value of which is determined from at least one pulse difference between the coordinate pair following the excitation pulse and at least one reference pulse value.

The reference pulse values can be, in particular, pulse values corresponding to a pulse space center, in particular, a pulse space center in the y-z plane.

The value of the pre-phasing moment is given, in particular, by the spacings of the coordinates of the coordinate pair from the reference pulse value divided by the gyromagnetic ratio.

By means of the pre-phasing moment, starting from the reference pulse values, a point corresponding to the coordinate pair in the pulse space can be approached. The improved concept thus also provides, in a systematic manner, the pre-phasing moments directly from the sequence of the sampling of the coordinate pairs and of the assignment of the coordinate pairs to the segmentation indices.

According to at least one embodiment, between a sampling of a coordinate pair and a subsequent further excitation pulse or a subsequent refocusing pulse, a re-phasing moment is applied, the value of which is determined from at least one pulse difference between the coordinate pair sampled before the further excitation pulse or the refocusing pulse and the at least one reference pulse value.

The value of the re-phasing moment is given from respective differences or spacings of the coordinates in the pulse space of the coordinate pair from the respective reference pulse values.

The re-phasing moments serve, for example, to approach the center of the pulse space and/or the reference pulse values before the application of a further excitation pulse. This serves, for example, to create defined starting conditions, which is advantageous, in particular, in the case of multiple refocusing.

According to at least one embodiment, after the application of the re-phasing moment, a further pre-phasing moment is applied.

According to the improved concept, the values of the re-phasing moments thus also result, in a systematic manner and directly from the sequence of the samplings of the coordinate pairs and of the assignment of the coordinate pairs to the segmentation indices.

According to at least one embodiment, at the center or the effective center of each excitation pulse, an effect of an applied gradient moment to the signal evolution comes about. Thus, at this time point, by definition, the corresponding y- and z-coordinates are equal to zero.

According to at least one embodiment, at the middle or the effective middle of each refocusing pulse, a current state of the signal evolution is inverted in that all the microscopic magnetic moments are rotated about an axis of the HF pulse by 180°. Thus, at this time point, by definition, the y- and z-coordinates are inverted.

According to at least one embodiment, for specifying the pulse space region to be sampled, the third pulse space dimension is assigned to a third phase-encoded axis or a third frequency-encoded axis. The magnetic resonance scan is carried out according to a phase-encoding according to the third phase-encoded axis or according to a frequency-encoding of the third frequency-encoded axis.

Apart from a frequency-encoding in the x-direction, the improved concept is thus also usable on a two-dimensional phase-encoding within the slice plane in combination with a phase-encoding along the slice axis. This can be advantageous, for example, for an SMS of a chemical shift, or "chemical shift imaging" (CSI), in which processing within the slice plane, for example, with two phase-encoded gradients takes place. The data is thus recorded here without a gradient field connected in parallel, in order to obtain additional spectroscopic information.

According to at least one embodiment, in the performance of the magnetic resonance scan, a plurality, that is, at least two, slices are excited simultaneously along the slice axis.

The simultaneously excited slices involve, in particular, spatially separated slices, that is, a non-continuous or discrete excitation region.

The simultaneous excitation takes place, in particular, by application of a slice-selection gradient moment along the z-direction and a corresponding embodiment of the excitation pulse. The slice-selection gradient moment is applied, in particular, during the excitation.

Thereby, in particular, a time saving in relation to individual slice excitation and a sequential series of a plurality of single slice excitations is achieved.

According to at least one embodiment, the magnetic resonance scan is carried out in accordance with a gradient echo image acquisition or according to an echo planar image acquisition, EPI, in particular an SS-EPI or an MS-EPI image acquisition or according to a spin echo image acquisition or according to a turbo spin echo image acquisition, SS-TSE or MS-TSE, or according to a gradient and spin echo image acquisition, SS-GRASE or MS-GRASE.

The improved concept is therefore very flexibly and universally usable for the most varied of image acquisition techniques.

According to a further independent aspect of the improved concept, a system for simultaneous multi-slice nuclear spin tomography is also provided. The system has a magnetic resonance tomography device and a processor. The processor is configured to specify a pulse space region that is to be sampled, whereby a first pulse space dimension is assigned a first phase-encoded axis. A second pulse space dimension is assigned to a second phase-encoded axis and the second phase-encoded axis corresponds to a slice axis. The processor is also configured to specify an undersampling scheme, whereby along the second pulse space dimension, an incomplete sampling is provided. The magnetic resonance tomography device is configured, in particular, activated by the processor to carry out a magnetic resonance scan within the pulse space region to be sampled according to the undersampling scheme and according to respective phase-encodings of the first and second phase-encoded axis.

Further embodiments of the system for simultaneous multi-slice nuclear spin tomography follow directly from the different embodiments of the method for simultaneous multi-slice nuclear spin tomography according to the improved concept.

According to a further independent aspect of the improved concept, a computer program is provided which has commands which, on execution of the computer program by a system according to the improved concept, in particular, by a processor of a system according to the improved concept, cause the system to carry out a method according to the improved concept.

According to a further independent aspect of the improved concept, a computer-readable storage medium is provided on which a computer program according to the improved concept is stored.

Magnetic resonance data is typically recorded in a defined inverse space by means of gradient moments $M_{x/y/z}$, also referred to as the pulse space or k-space. For the pulse space coordinates, $k_{x/y/z} = \gamma \int dt\, G_{x/y/z}(t)$ applies, where y denotes the gyromagnetic ratio and the time integral is calculated over the gradient amplitudes $G_{x/y/z}$ applied from the time point of the excitation of transverse magnetization. From the data recorded for the pulse space coordinates, the images can then be calculated by Fourier transform in the position space coordinates.

A discretization of the data recorded can be described, for example, by means of a comb function, that is, via a sum of incrementally displaced Dirac functions. A complete sampling of a position space region of the extent $FOV_i$ with a resolution of $N_i$ points requires an increment $\Delta k_i = 1/FOV_i$. In this way, signal contributions of spins at the spacing $FOV_i$ are displaced precisely by $2\pi$ relative to one another and all positions within $FOV_i$ have a clearly assignable phase.

Through optional oversampling with an oversampling factor $OS_i$ (0 represents no oversampling, 1 represents 100% oversampling), there results $\Delta k_i = 1/(FOV_i*(1+OS_i))$.

In magnetic resonance imaging, for a spatial encoding within the slice plane (for example, the x-y plane) frequency-encoding and/or phase-encoding are used, for example, a frequency-encoding along the x-axis and a phase-encoding along the y-axis.

For the phase-encoding, before the data recording, a, for example, constant magnetic field with a defined, for example, linear position-dependency is switched for a specified time duration. By means of recording with, for example, different time durations and/or gradient amplitudes, the necessary pulse space coordinates can be realized.

For a frequency-encoding, during the data recording, a, for example, constant magnetic field with a defined, for example, linear position-dependency is switched. Data points recorded at a particular temporal spacing following one another then differ specifically by a pulse space increment which is multiplied by the temporal spacing and is given by the gyromagnetic ratio and the corresponding gradient amplitudes. Through a suitable selection of gradient amplitudes and temporal spacing, a pulse space increment can be realized which corresponds to the desired $FOV_X$ and $OS_x$. An optional additional gradient moment before the data recording (pre-phasing moment) can ensure the suitable initial pulse space coordinates.

The phase-encoding along the slice axis according to the improved concept creates the foundation for a simple, unified and extremely flexible determination of blip patterns and pre-phasing and re-phasing moments. In different exemplary embodiments of the improved concept, according to the sampling theorem, $k_y$ and $k_z$ pulse space coordinates that are to be completely sampled are specified, whereby one of the coordinates, in particular the $k_z$-coordinate corresponds to an SMS encoding along the slice axis.

For example, after specifying an undersampling scheme and determining the pairs of pulse space coordinates to be sampled and specifying a segmentation scheme which is identified by one or more segmentation indices, each pair of pulse space coordinates can be assigned to a tuple of segmentation indices.

The magnetic resonance scan can then be carried out, whereby each data recording is unambiguously assigned to a tuple of segmentation indices, therefrom the corresponding pair of nearest pulse space coordinates is determined and from current and nearest pulse space coordinates, required increments, in particular gradient moments, are determined. Finally, gradient moments which realize the necessary increments are switched.

In different embodiments, it is the case that at the effective center of a high-frequency excitation pulse, y- and z-pulse space coordinates are zero in each case and at the effective center of a high-frequency refocusing pulse y- and z-pulse space coordinates are inverted and therebetween a development takes place according to $k_{y/z} = \gamma \int dt\, G_{y/z}(t)$.

The remaining x-axis can also be treated similarly.

Figure 1:
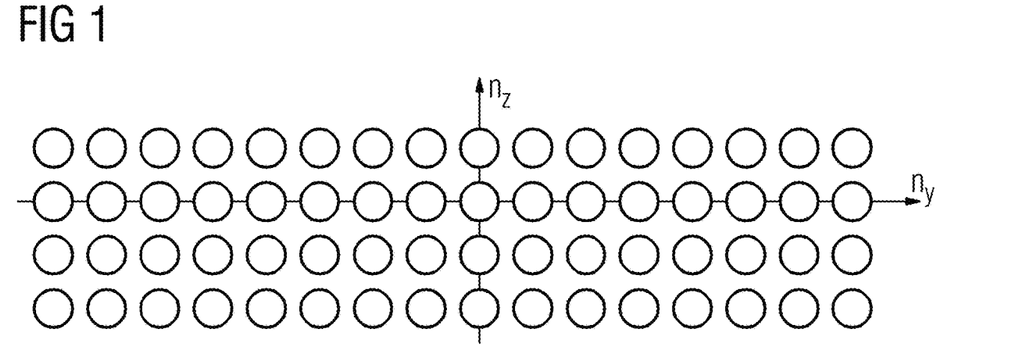
FIG. 1 illustrates a specified pulse space region according to an exemplary embodiment of an improved method.

It is shown schematically in FIG. 1 how according to a method for simultaneous multi-slice nuclear spin tomography, SMS, according to the improved concept, a pulse space region can be specified. FIG. 1 shows on a horizontal axis dimensionless y-coordinates $n_y$ which correspond to a pulse direction within a slice plane. On a vertical axis, dimensionless z-coordinates $n_z$ are represented, which correspond to a pulse direction along the slice axis. Each circle in FIG. 1 represents a discrete point $(n_y, n_z)$ in the y-z plane of the pulse space. A similar principle applies also for FIGS. 2 to 6, FIGS. 10 and 11 and FIG. 13.

The numbers $n_y$ and $n_z$ number the corresponding coordinates along the y-axis and the z-axis. The number of points along the axes and the actual pulse spacing between two adjacent points that correspond to the dimensionless points is given according to the sampling theorem from the corresponding extents of the image region, $FOV_{y/z}$, for example, according to $\Delta k_{y/z} = 1/(FOV_{y/z}*(1+OS_{x/y}))$.

The pulse space region shown relates, by way of example, to four simultaneously excited slices along the z-axis and sixteen image points within the slice plane along the y-axis.

FIGS. 2 to 6 show different undersampling schemes. All the undersampling schemes shown have in common that a sampling along the z-direction is incomplete. Those points in the pulse space which are sampled according to the undersampling scheme are identified with crosses, whilst empty circles correspond to points in the pulse space that are not sampled.

Undersampling can be used, in principle, along each of the phase-encoding axes, that is, in particular along the z- and y-axes.

Regular undersampling schemes can be determined, for example, by program means. Advantageously, the undersampling scheme is selected or displaced such that both in the y- and also the z-direction, the center of the pulse space (that is $n_z = n_y = 0$) is actually sampled.

Figure 2:
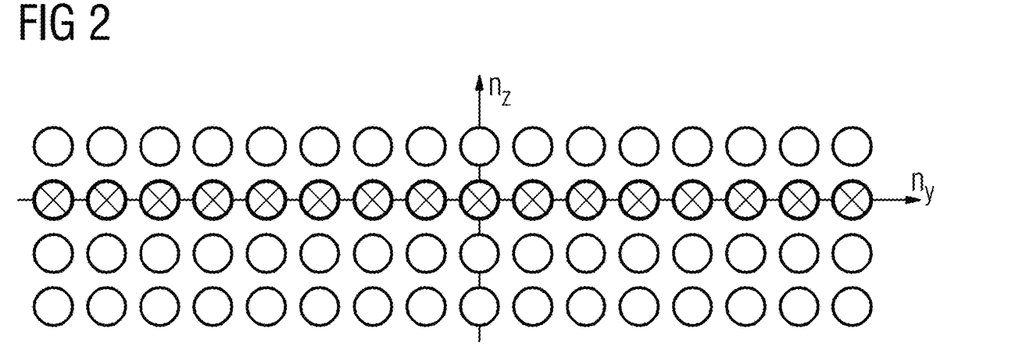
FIGS. 2 to 6 illustrate schematic representations of different undersampling schemes according to exemplary embodiments of an improved method.

In FIG. 2, for example, a simple conventional undersampling is shown, whereby simultaneously excited slices have no relative displacement along the z-direction. The undersampling is here restricted to the z-direction, that is, for a sampled z-coordinate which corresponds, for example, in the instance shown to $n_z = 0$, all the y-coordinates are sampled in the pulse space that is to be sampled.

Parallel or simultaneous imaging can function with undersampling to accelerate the imaging. Lacking information can be enhanced with mathematical methods. For this, in particular, additional information can be called upon, resulting from spatial sensitivity profiles of the corresponding high-frequency receiving coils.

For the undersampling scheme of FIG. 2, the reconstruction of the image requires a coil sensitivity profile at least in the z-direction.

Therefrom results a list of coordinate pairs $(n_y, n_z)$ to be sampled:

(−8,0),(−7,0),(−6,0),(−5,0),(−4,0),(−3,0) (−2,0),(−1,0) (0,0),(1,0),(2,0),(3,0),(4,0),(5,0),(6,0),(7,0).

Figure 3:
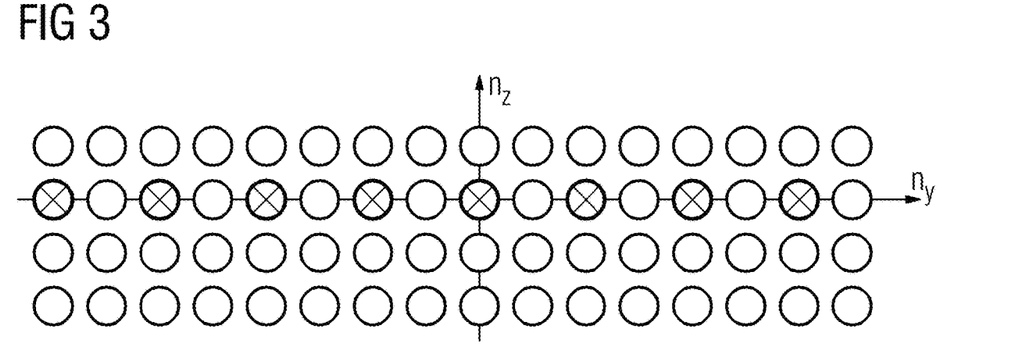

FIG. 3 shows a two-fold conventional undersampling, also without relative displacement of the simultaneously excited slices along the z-direction. For each sampled z-coordinate, in this case $n_z = 0$, only every second y-coordinate is sampled.

Thereby, initially missing information can be enhanced in the context of the image reconstruction using spatial sensitivity profiles of the receiving coils of the magnetic resonance tomography device, for example, determined by a dedicated reference scan with known methods (GRAPPA, SENSE).

With regard to FIG. 3, for the reconstruction of the image, both a coil sensitivity profile in the y-direction and also in the z-direction will be required.

Therefrom results a list of coordinate pairs $(n_y, n_z)$ to be sampled:

(−8,0),(−6,0),(−4,0),(−2,0),(0,0),(2,0),(4,0),(6,0).

Figure 4:
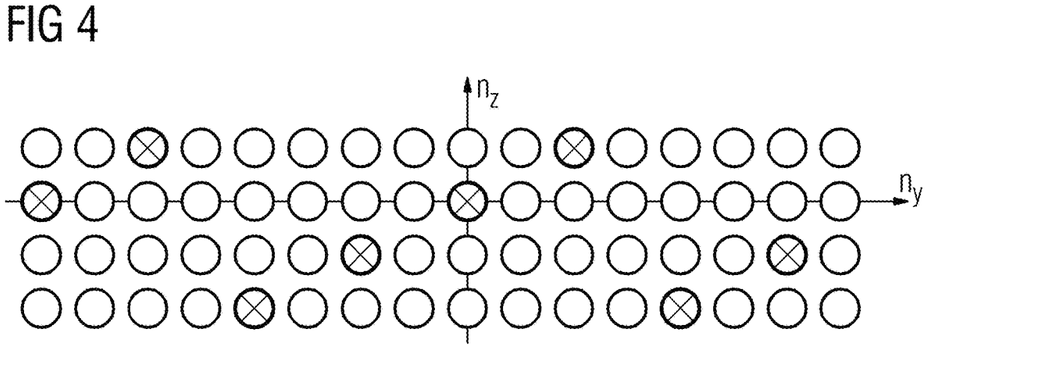

In FIG. 4, a two-fold undersampling with use of a CAIPIRINHA (Controlled Aliasing in Parallel Imaging Results in Higher Acceleration) technique in the direction of the slice axis is shown. Simultaneously excited slices thereby have a relative displacement to one another, in the example shown, by ¼ $FOV_y$. A reconstruction of the image requires at least one coil sensitivity profile in the y-direction.

The undersampling scheme in FIG. 4 shows in effect a conventional undersampling with slice-CAIPIRINHA, wherein exactly one systematically incremented z-coordinate per recorded z-coordinate is used.

Therefrom results a list of coordinate pairs $(n_y, n_z)$ to be sampled:

(−8,0),(−6,1),(−4,−2),(−2,−1),(0,0),(2,1),(4,−2),(6,−1).

Figure 5:
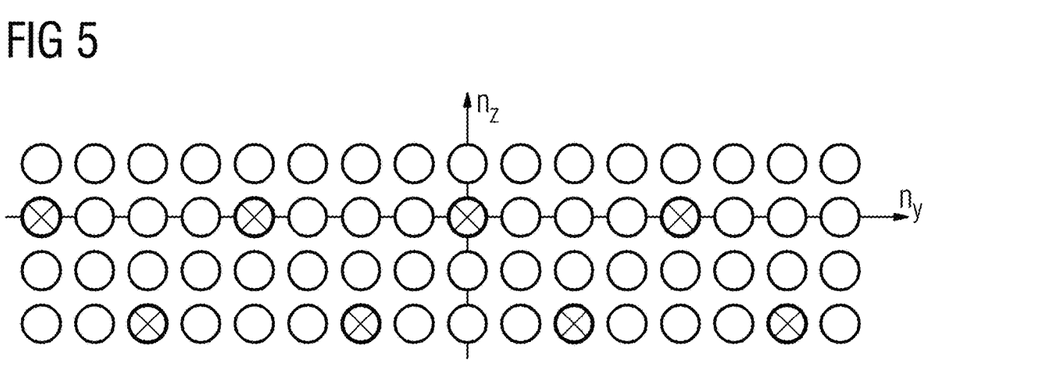

In FIG. 5, a two-fold undersampling with the CAIPIRINHA technique along the slice axis is again shown. Herein, the simultaneously excited slices have a relative displacement by ½ $FOV_y$. The reconstruction accordingly requires coil sensitivity profiles both in the y-direction and also in the z-direction. Herein, what is involved is a conventional slice CAIPIRINHA undersampling in which exactly one systematically incremented z-coordinate per recorded y-coordinate is used.

Therefrom results a list of coordinate pairs $(n_y, n_z)$ to be sampled:

(−8,0),(−6,−2),(−4,0),(−2,−2),(0,0),(2,−2),(4,0),(6,−2).

Figure 6:
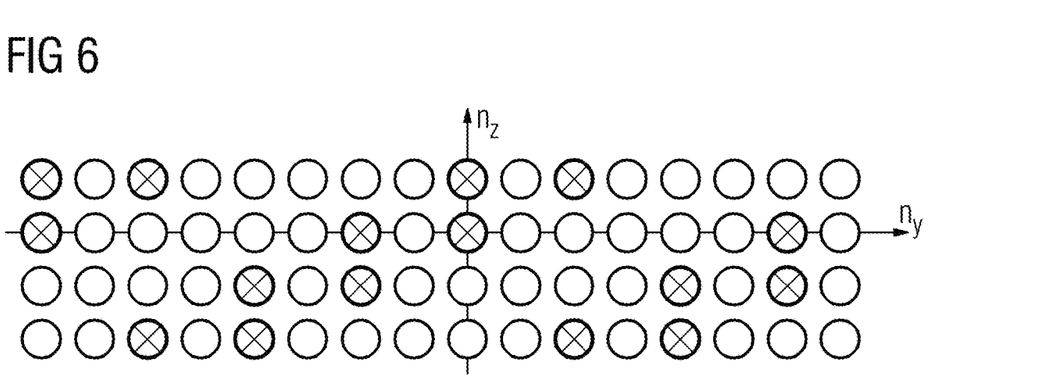

FIG. 6 shows an undersampling scheme with a two-fold undersampling according to a generalized CAIPIRINHA technique. In this example, a displacement of the simultaneously excited slices cannot be considered to occur, rather what takes place is an overlaying of slices with different phase offsets which are each offset by ¼ $FOV_y$. The reconstruction of such an image requires at least coil sensitivity profiles in the y-direction. Herein, what is involved is an unconventional slice CAIPIRINHA undersampling with two systematically incremented z-coordinates per recorded y-coordinate.

Therefrom results a list of coordinate pairs $(n_y, n_z)$ to be sampled:

(−8,0),(−8,1),(−6,−2),(−6,1)(−4,−2),(−4,−1),(−2,−1), (−2,0),(0,0),(0,1),(2,−2),(2,1),(4,−2),(4,−1),(6,−1),(6,0).

Figure 7:
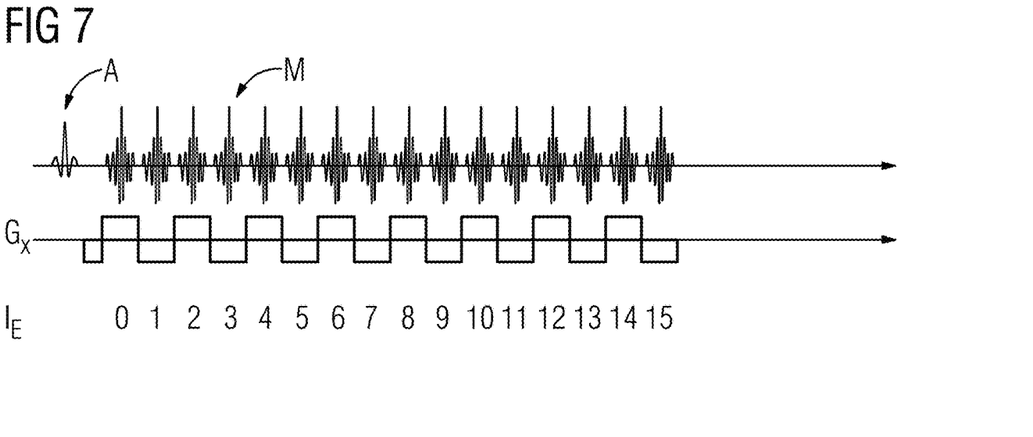
FIGS. 7 to 9 illustrates schematic representations of different segmentation schemes according to exemplary embodiments of an improved method.
Figure 8:
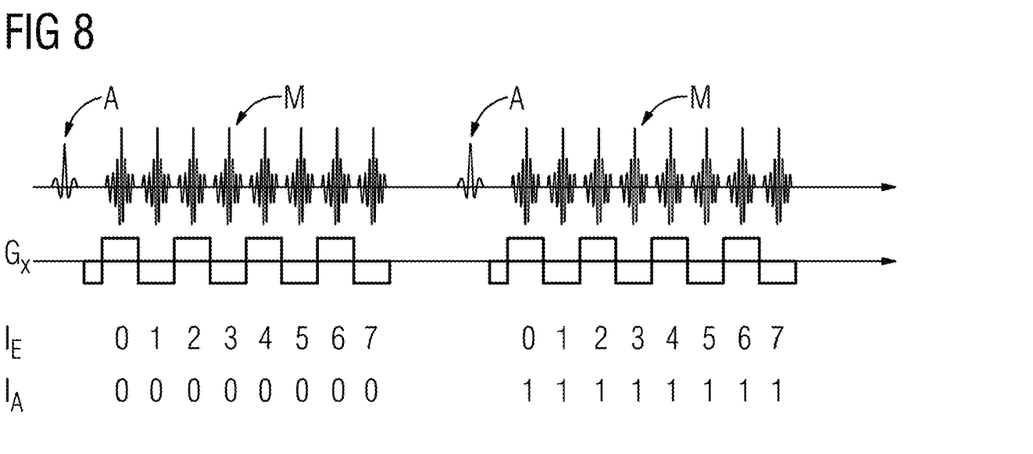
Figure 9:
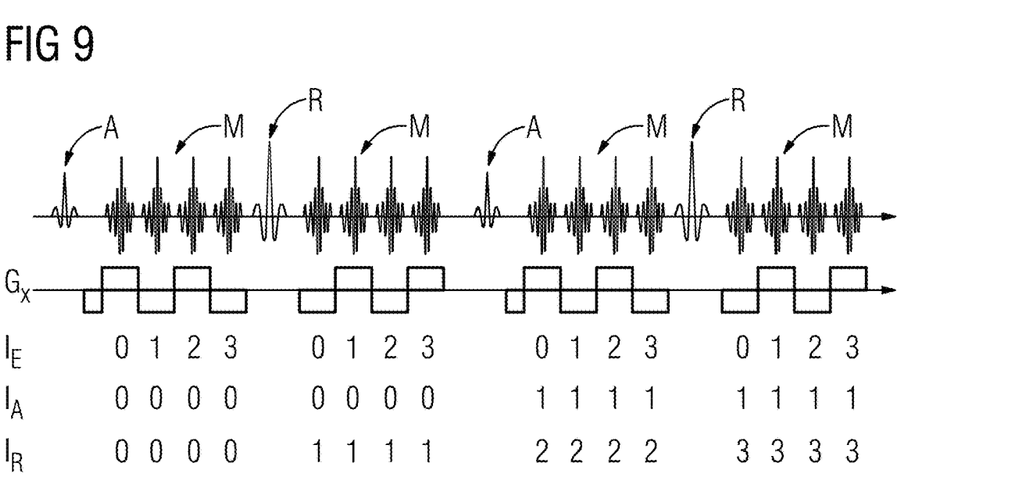

FIGS. 7 to 9 show different segmentation schemes according exemplary embodiments, which can be used in the context of the improved concept.

FIG. 7 shows an SS-EPI scan according to an exemplary embodiment, where the segmentation is identified here by a single segmentation index, specifically the echo index $I_E$. The echo index $I_E$ gives the number or position of the respective echo, that is, of the corresponding scan signal or of the associated recording time period, which follows an excitation pulse A. Accordingly, FIG. 7 shows a single excitation A and a plurality, in the example of FIG. 7, 16 of echoes or scan signals M following thereafter. Furthermore, in FIG. 7, a progression of a gradient amplitude $G_x$ along the x-axis, that is, in particular along the frequency-encoded x-axis, is shown. Surfaces which enclose the gradient amplitude $G_x$ with the time axis, produce the corresponding gradient moments.

The gradient moments contain, for example, a pre-phasing moment before the first of the scan signals M. Thereupon, during each recording time period, corresponding gradient amplitudes $G_x$ are switched in order to sample different points along the x-axis of the pulse space.

FIG. 8 shows an analogous representation to that in FIG. 7, in this case for an MS-EPI scan in which the segmentation scheme is characterized, apart from the echo index $I_E$, by an excitation index $I_A$. In the MS-EPI scan, a plurality of excitation pulses A is used, each followed by a plurality, in the example shown 8, of recording time periods or scan signals M. The excitation index $I_A$ identifies the number of excitation pulses A or the position or sequence of the excitation pulse in relation to all the excitation pulses A. It should be noted herein that the number of excitation pulses A is naturally not restricted to two, but according to the actual requirements, can also be larger. Each tuple of echo index $I_E$ and excitation index $I_A$ accordingly denotes unambiguously one of the recording time periods or one of the scan signals M.

In FIG. 9, an analogous representation of an MS-GRASE scan is shown, that is a gradient and spin echo scan with a plurality of excitations. In the example shown, following an excitation pulse A is a plurality of recording time periods and scan signals M, for example four, whereupon a refocusing pulse R is applied, followed by a further plurality of scan signals M, for example, four again. A similar sequence of scan signals M and the further refocusing pulse R, follows a further excitation pulse A. It should be noted that the number of respective refocusing pulses per excitation pulse A or the number of the respective recording time periods and scan signals M per excitation pulse A and/or per refocusing pulse R are selected here, by way of example, and can deviate from those given depending upon the actual requirements.

Here, the segmentation scheme is characterized apart from the echo index $I_E$ and the excitation index $I_A$, by a refocusing pulse $I_R$, whereby the refocusing index $I_R$ characterizes the corresponding refocusing segment, that is, assigns the recording time periods or scan signals M to one of the refocusing pulses R or excitation pulses A. Thereby, the refocusing index $I_R$ comes about through each refocusing pulse R. This is based thereon that a refocusing segment is also assigned to the recording time periods between each excitation pulse A and a subsequent refocusing pulse R.

Each tuple of echo index $I_E$, excitation index $I_A$ and refocusing index $I_R$ thus clearly characterizes a recording time period and an associated scan signal M.

Figure 10:
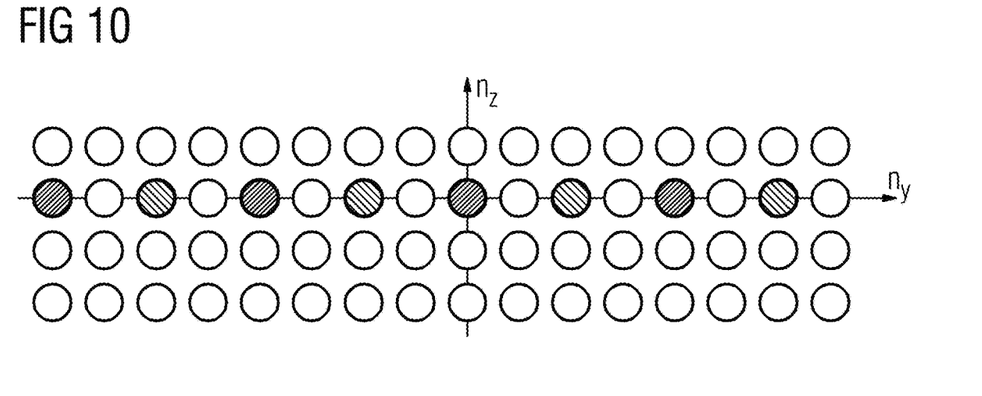
FIGS. 10 and 11 illustrate schematic representations of different segmentation schemes according to exemplary embodiments of an improved method.
Figure 11:
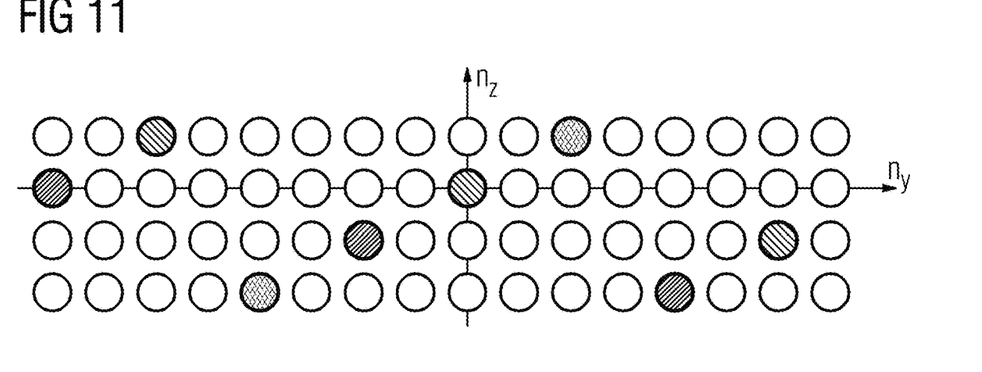

In FIGS. 10 and 11, an assignment of the pulse space coordinate pairs to respective tuples of segmentation indices is shown according to a respective segmentation scheme. In principle, for example, any desired assignments can be selected between the pulse space coordinate pairs for y and z axes and segmentation tuples. For example, a nested loop can extend over each index of the segmentation indices and respectively the next coordinate pair from the list in which the coordinate pairs are stored can be removed and assigned. In an exemplary embodiment, a corresponding pseudocode can read as follows:

```
Element = 0
for ( Index__1 = 0 ... MaxIndex__1 )
{
    for ( Index__2 = 0 ... MaxIndex__2 )
    {
        ...
        Tuple = { Index__1, Index__2, ... }
        Assignment( Tuple) = L( Element )
        Element = Element + 1
    }
}
```

Taking account of the physics underlying magnetic resonance and the development of the magnetization over time, for example by means of the relaxation with relaxation times T1, T2, T2* or the successive construction of signal phases, it can however be useful to use the specifically adapted assignments.

For an echoplanar imaging, it can be advantageous, for example, to record $k_y$-coordinates in successive echoes with a constant increment. In this way, for example, background fields such as field inhomogeneities due to susceptibility differences in the tissue have an effect through eddy currents, induced fields or accompanying Maxwell field components in a defined way on the pulse space encoding and lead to image artifacts, for example, distortions which can be corrected with known techniques.

An exemplary assignment for an undersegmentation scheme, as shown in FIG. 3, in conjunction with an SS-EPI scan, as shown in FIG. 7, can be selected as follows, wherein "element" denotes the position of the coordinate pair in the list described in relation to FIG. 3:

$I_E$: 0 1 2 3 4 5 6 7
Element 0 1 2 3 4 5 6 7

A further exemplary assignment for the undersegmentation scheme of FIG. 3 in combination with an MS-EPI scan can be undertaken as follows:

$I_E$: 0 1 2 3 0 1 2 3
$I_A$: 0 0 0 0 1 1 1 1
Element 0 2 4 6 1 3 5 7

A corresponding representation of the latter example is shown in FIG. 10, whereby different shadings correspond here to different excitation indices $I_A$.

A further exemplary assignment for an undersegmentation scheme, as shown in FIG. 4, in conjunction with an SS-EPI scan, can be undertaken as follows, wherein "element" denotes the position of the coordinate pair in the list described in relation to FIG. 4:

$I_E$: 0 1 2 3 4 5 6 7
Element 0 1 2 3 4 5 6 7

A further exemplary assignment for an undersegmentation scheme, as shown in FIG. 4, in conjunction with an MS-EPI scan, as shown in FIG. 8, can be undertaken as follows:

$I_E$: 0 1 2 0 1 2 0 1 2
$I_A$: 0 0 0 1 1 1 2 2 2
Element 0 3 6 1 4 7 2 5 –

A corresponding representation of the latter example is shown in FIG. 11. Different shadings correspond to different excitation indices $I_A$.

It should be noted that in this case one echo more is generated than is necessary for the data recording, by way of example. The data from this echo can, for example, be discarded or alternatively, the echo is actually no longer recorded.

Figure 12:
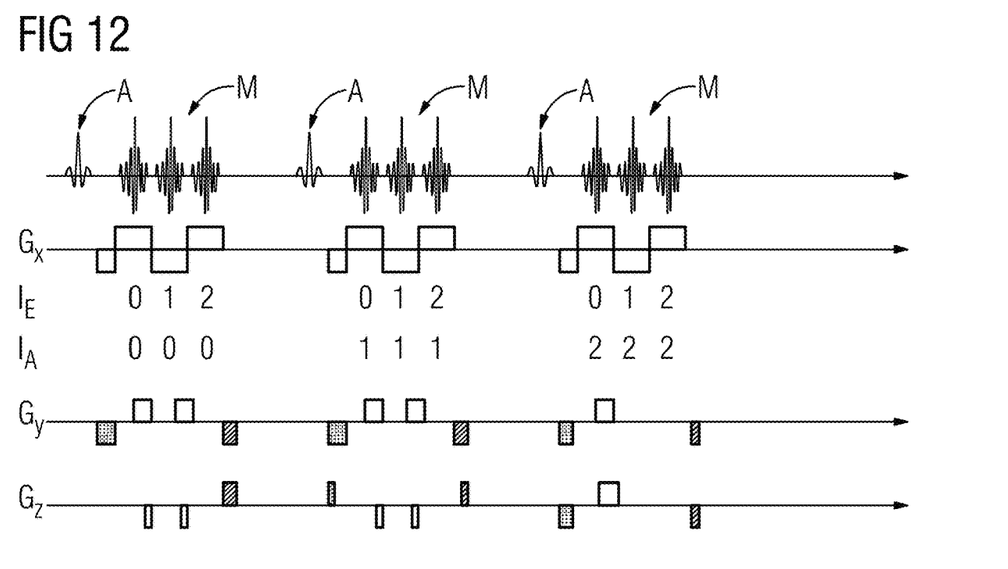
FIG. 12 illustrates a schematic representation of a magnetic resonance scan according to an exemplary embodiment of an improved method.

FIG. 12 shows an exemplary scan sequence according to the improved concept with correspondingly determined gradient moments and gradient amplitudes $G_y$, $G_z$ along the y and z pulse space dimensions. As an example, the same combination of undersegmentation schemes and MS-EPI scan is shown as in FIG. 11.

By the assignment, as described in relation to FIG. 11 and the pattern of the scan sequence, the tuple currently to be recorded results directly. By means of the list with the coordinate pairs, the pair of pulse space indices or pulses $(n_y', n_z')$ to be set can thereby be determined unambiguously. Thus, the current pulse space indices $(n_y, n_z)$ can be determined successively. The necessary gradient moments for the corresponding changes of the pulse space coordinates by $(n_y'-n_y, n_z'-n_z)$ results directly from relationship $M_{y/z}=(n'_{y/z}-n_{y/z})*\Delta k_{y/z}/\gamma$. Here, $\Delta k_{y/z}$ corresponds to the relevant pulse space increments determined according to the sampling theorem and $\gamma$ corresponds to the gyromagnetic ratio.

The different shadings in the gradient amplitudes $G_y$, $G_z$ in FIG. 12 correspond respectively to pre-phasing amplitudes or moments, rephasing amplitudes or moments and corresponding gradient amplitudes necessary for the displacement of the y- and z-coordinates or moments between the individual recording time periods (blips). In the manner described, the pulse space to be recorded can therefore be sampled systematically.

Similarly to the examples shown here, the improved concept, as will be immediately clear to a person skilled in the art is usable for any desired undersampling scheme in combination with any desired scan modes, in particular MS scan recordings.

Figure 13:
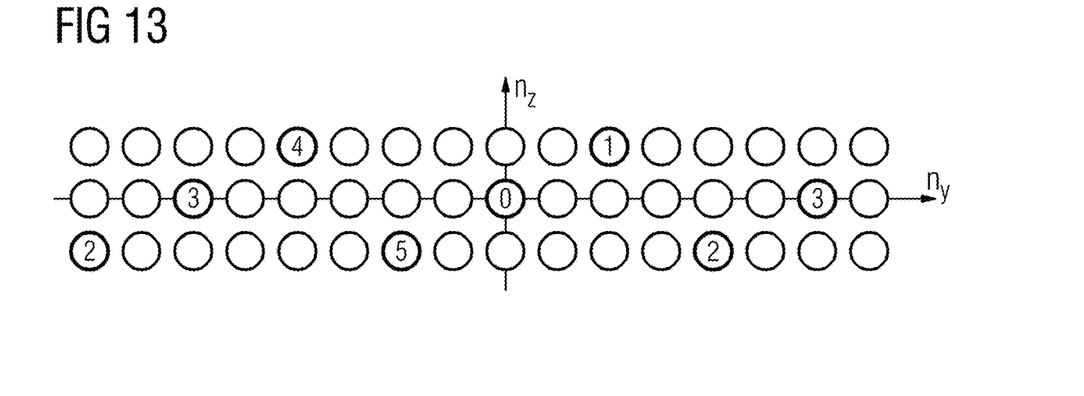
FIG. 13 illustrates a schematic representation of a segmentation scheme according to an exemplary embodiment of an improved method.
Figure 14:
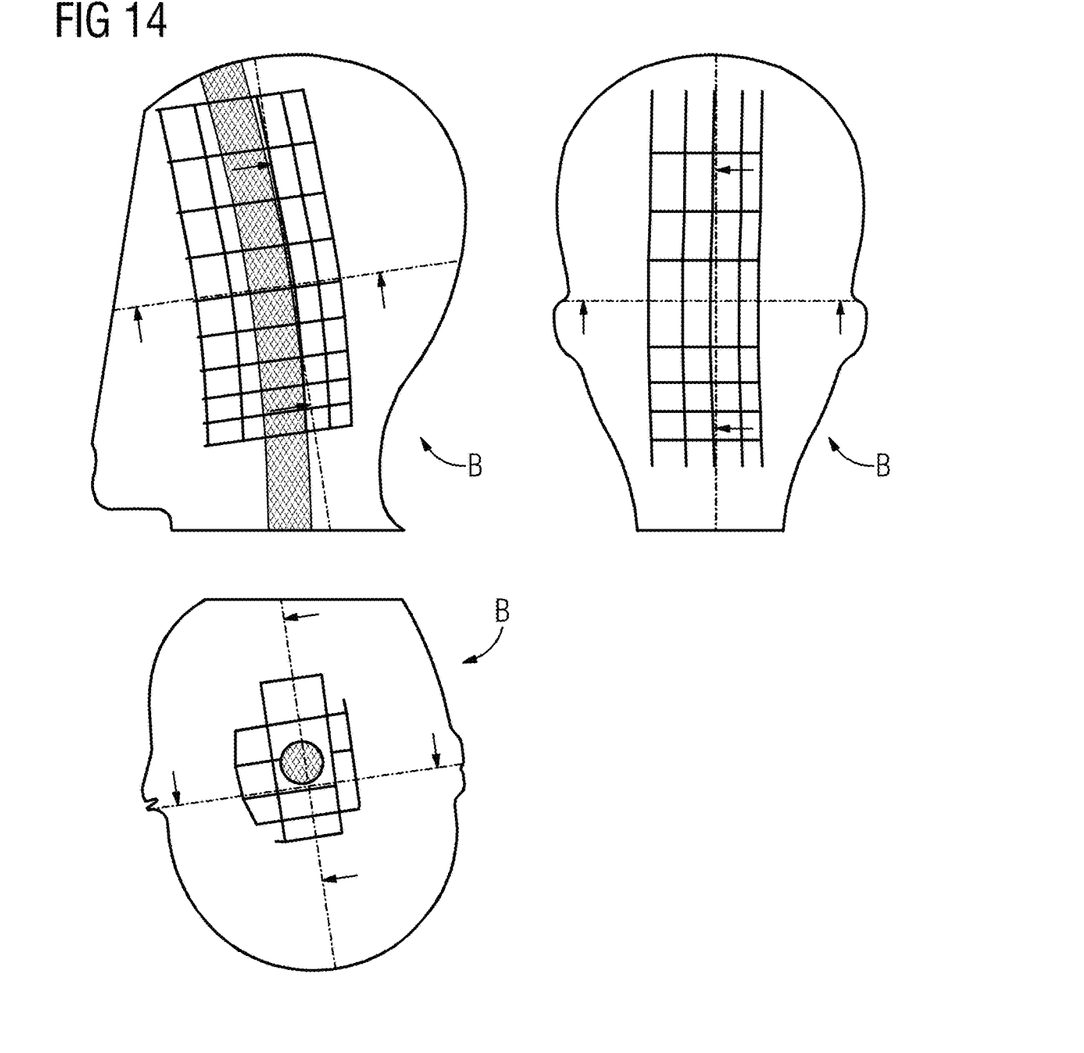
FIG. 14 illustrates reconstructed exemplary images according to an exemplary embodiment.

FIG. 14 shows a phantom scan according to an exemplary embodiment in which a method according to the improved concept is put to use. A corresponding representation of the pulse space to be recorded including the exemplary undersampling scheme and the exemplary assignment between y- and z-pulse space coordinates to be sampled and segmentation tuples are shown in FIG. 13.

With the MS-EPI scan, in six segments (that is, for example, with six separate excitation pulses), data for an $n_y$-$n_z$ extent of the pulse space of 224×3 (phase encoding direction×SMS direction) is recorded. Within the slice plane, undersampling with a factor of 2 was undertaken. The three simultaneously created slices were displaced against one another with the sketched CAIPIRINHA sampling pattern effectively by FOV/3 (recording of the pulse space coordinates identified by numbers with the excitation indicated by corresponding numbers). The images B were reconstructed, for example, by means of slice-GRAPPA algorithms.

Figure 15:
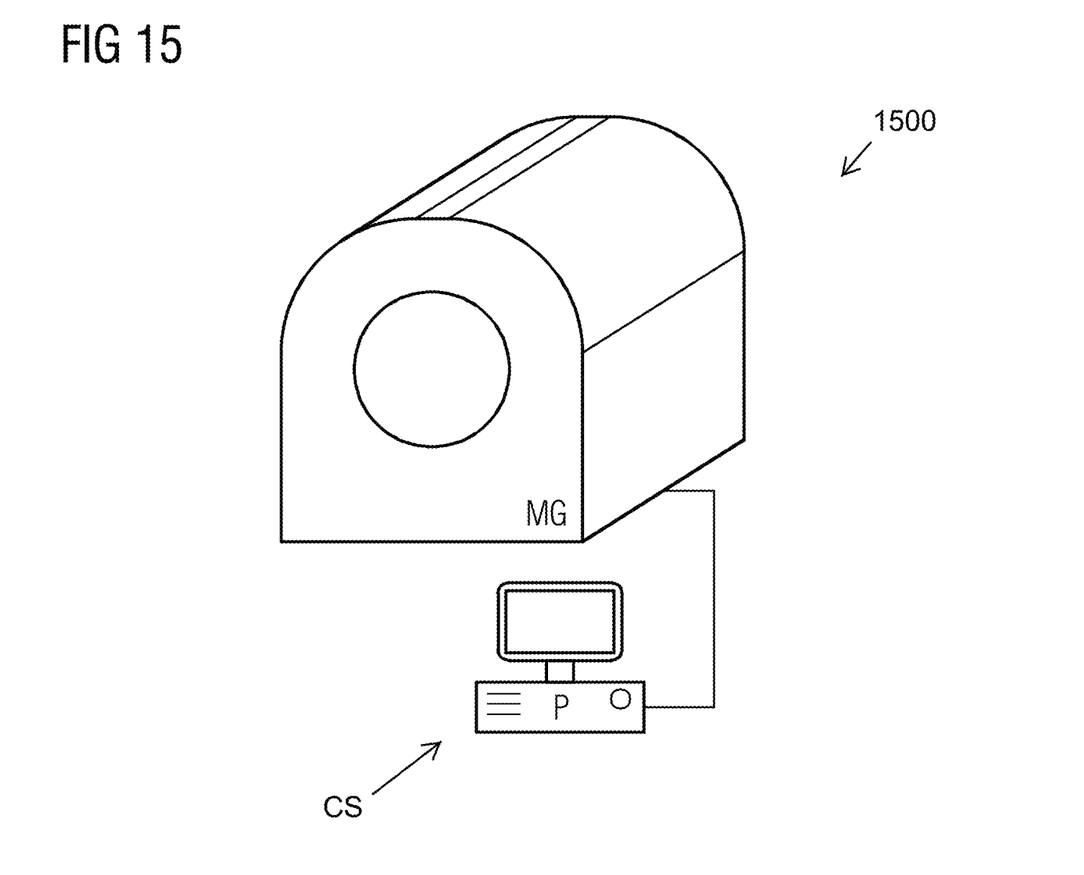
FIG. 15 illustrates a system for simultaneous multi-slice nuclear spin tomography according to an exemplary embodiment.

FIG. 15 shows a schematic representation of a system 1500 according to an exemplary embodiment.

The system 1500 has a magnetic resonance tomography (MRT) device MG to which a computer system CS is coupled. The MRT device MG can also be referred to as an MRT scanner. In an exemplary embodiment, the computer system CS comprises a processor P. The computer system CS can also comprise a computer program (e.g. stored on an internal and/or external memory) according to the improved concept which can be carried out by the processor P. In an exemplary embodiment, the computer system CS is a controller that is configured to control the overall operation of the magnetic resonance tomography device MG. For example, the processor P can generate one or more control signals that are provided to the MRT device MG to control the operation of the MRT device MG. In an exemplary embodiment, the computer system CS includes processor circuitry that is configured to perform one or more operations and/or functions of the computer system CS.

According to the improved concept, it is enabled for complex segmented recording methods, in particular multi-dimensional segmented recording methods, to calculate and to determine, with any desired undersamplings within the slice plane and for all conceivable combinations of the number of simultaneously created slices and mutual displacements, the correspondingly required phase encoding gradients before, between and after each echo. The method is thereby not restricted to regular, in particular, conventional slice-CAIPIRINHA samplings.

The availability of the pulse space coordinates for all the recorded data enables automated sequence tests to be carried out. Thereby, the fundamental sampling principles that are independent of the actual sequence, such as for example, the sampling theorem can be used in order to test the recorded coordinate combinations for completeness, possibly taking account of a defined undersampling, and to ensure the consistency of each coordinate combination with the accumulated gradient moments.

The availability of the pulse space coordinates in the y- and z-direction for all the recorded data can also be used in the context of the reconstruction. Thus, for example, conventional one or two-dimensional GRAPPA reconstruction algorithms can be used and dedicated slice-GRAPPA algorithms which require, in particular, prior knowledge of slice displacements carried out are no longer required.

If a diagnosis of planned slice stacks contains more slices than are excited simultaneously, the data can be recorded successively in blocks of, for example, Nz slices in a spacing of D according to the improved concept. A slice stack with the slice thickness T and the slice spacing F and $P_z=p^*N_z$ can be used for an optimum signal separation $D=p^*(T+F)$.

Displacements of a set of slices simultaneously excited along the phase encoding directions (including the displacement along the slice axis of slices on the slice axis, in the example therefore, along the z-axis) can be realized, for example with a phase additionally impressed during the signal modulation. An additionally required phase term can herein be determined for each pulse space coordinate recorded with knowledge of the corresponding spatial displacement vector. For a frequency-encoding axis, for the signal modulation, apart from a constant phase offset, if relevant, a frequency offset is also to be taken into account.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for simultaneous multi-slice nuclear spin tomography using a magnetic resonance tomography (MRT) system having an MRT scanner and a processor, the method comprising:
specifying, by the processor, a pulse space region to be sampled, a first pulse space dimension being assigned to a first phase-encoded axis, wherein a second pulse space dimension is assigned to a second phase-encoded axis and the second phase-encoded axis corresponds to a slice axis;
specifying, by the processor, an undersampling scheme, wherein an incomplete sampling is provided along the second pulse space dimension; and
controlling, by the processor, the MRT scanner to perform a magnetic resonance scan within the pulse space region to be sampled based on the undersampling scheme and respective phase-encodings of the first and the second phase-encoded axis.

2. The method as claimed in claim 1, wherein:
the specification of the undersampling scheme comprises determining coordinate pairs to be sampled; and
each coordinate pair of the determined coordinate pairs contains a first coordinate in relation to the first pulse space dimension and an associated second coordinate in relation to the second pulse space dimension.

3. The method as claimed in claim 2, wherein, to perform the magnetic resonance scan, the processor is configured to control the MRT scanner to record scan signals during associated recording time periods, each recording time period being assigned, according to a segmentation scheme, to an excitation pulse such that at least one segmentation index is unambiguously assigned to each recording time period.

4. The method as claimed in claim 3, wherein each recording time period is assigned, according to the segmentation scheme, to a refocusing pulse such that at least two segmentation indices are unambiguously assigned to each recording time period.

5. The method as claimed in claim 3, wherein, to perform the magnetic resonance scan, each coordinate pair is assigned to exactly one tuple of segmentation indices to define a sequence of a sampling of the coordinate pairs during the magnetic resonance scan.

6. The method as claimed in claim 5, further comprising applying at least one gradient moment between samplings of two successive coordinate pairs according to the sequence, the value of the at least one gradient being determined from at least one pulse difference between the successive coordinate pairs.

7. The method as claimed in claim 5, further comprising applying at least one pre-phasing moment between the excitation pulse and a sampling of a subsequent coordinate pair of the coordinate pairs, the value of the least one pre-phasing moment being determined from at least one pulse difference between the coordinate pair following the excitation pulse and at least one reference pulse value.

8. The method as claimed in claim 4, wherein, to perform the magnetic resonance scan, each coordinate pair is assigned to exactly one tuple of segmentation indices to define a sequence of a sampling of the coordinate pairs during the magnetic resonance scan.

9. The method as claimed in claim 8, further comprising applying at least one gradient moment between samplings of two successive coordinate pairs according to the sequence, the value of the at least one gradient being determined from at least one pulse difference between the successive coordinate pairs.

10. The method as claimed in claim 8, further comprising applying at least one pre-phasing moment between the excitation pulse and a sampling of a subsequent coordinate pair of the coordinate pairs, the value of the least one pre-phasing moment being determined from at least one pulse difference between the coordinate pair following the excitation pulse and the at least one reference pulse value.

11. The method as claimed in claim 5, further comprising, between a sampling of a coordinate pair the coordinate pairs and a subsequent further excitation pulse or a refocusing pulse, applying a re-phasing moment, the value of the re-phasing moment being determined from at least one pulse difference between the coordinate pair sampled before the further excitation pulse and at least one reference pulse value.

12. The method as claimed in claim 1, wherein:
a third pulse space dimension is assigned to a third phase-encoded axis or to a frequency-encoded axis to specify the pulse space region to be sampled; and
the magnetic resonance scan is carried out according to a phase-encoding of the third phase-encoded axis or according to a frequency-encoding of the frequency-encoded axis.

13. The method as claimed in claim 1, wherein, in the magnetic resonance scan comprises simultaneously executing a plurality of slices along the slice axis.

14. The method as claimed in claim 1, wherein the magnetic resonance scan is carried out according to:
a gradient echo image acquisition;
an echoplanar image acquisition;
a spin-echo image acquisition;
a turbo spin-echo image acquisition; or
a gradient-and-spin-echo image acquisition.

15. A non-transitory computer-readable storage medium with an executable program stored thereon, that when executed, instructs the processor to perform the method of claim 1.

16. A computer program product having a computer program which is directly loadable into a memory of the MRT system, when executed by the processor, causes the MRT system to perform the method as claimed in claim 1.

17. A system for simultaneous multi-slice nuclear spin tomography, comprising:
a magnetic resonance tomography (MRT) scanner; and
a processor configured to:
specify a pulse space region to be sampled, a first pulse space dimension being assigned to a first phase-encoded axis;
assign a second pulse space dimension to a second phase-encoded axis corresponding to a slice axis;
specify an undersampling scheme, an incomplete sampling being provided along the second pulse space dimension; and
control the MRT scanner to perform a magnetic resonance scan within the pulse space region to be sampled based on the undersampling scheme and respective phase-encodings of the first and the second phase-encoded axis.

* * * * *